(12) United States Patent
Wei et al.

(10) Patent No.: US 11,056,544 B1
(45) Date of Patent: Jul. 6, 2021

(54) DISPLAY PANEL AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventors: Feng Wei, Guangdong (CN); Jinchuan Li, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 16/962,058

(22) PCT Filed: May 18, 2020

(86) PCT No.: PCT/CN2020/090870
§ 371 (c)(1),
(2) Date: Jul. 14, 2020

Related U.S. Application Data

(63) Continuation of application No. PCT/CN2020/090870, filed on May 18, 2020.

(30) Foreign Application Priority Data

Apr. 28, 2020 (CN) .......................... 202010349224.9

(51) Int. Cl.
*H01L 27/32* (2006.01)

(52) U.S. Cl.
CPC .... *H01L 27/3218* (2013.01); *H01L 2227/323* (2013.01)

(58) Field of Classification Search
CPC .......... H01L 27/3218; H01L 2227/323; H01L 27/3246; H01L 27/32
USPC ....................................... 257/79; 438/22, 24
See application file for complete search history.

(56) References Cited

U.S. PATENT DOCUMENTS

2016/0240592 A1* 8/2016 Li ....................... H01L 27/3216
2020/0212129 A1* 7/2020 Jeong .................. H01L 27/3213

* cited by examiner

Primary Examiner — Didarul A Mazumder

(57) ABSTRACT

A display panel includes a substrate, a pixel defining layer defining a plurality of subpixel areas, and a plurality of subpixels. The plurality of subpixels are disposed in the plurality of subpixel areas in one-to-one correspondence. Each of the plurality of subpixels includes a primary pixel and a secondary pixel surrounding the primary pixel. The primary pixel and the secondary pixel are independently driven by different driving circuits, respectively. By configuring the subpixels into the primary pixel and the secondary pixel surrounding the primary pixel and driving the primary pixel and the secondary pixel independently, it is beneficial to adjust brightness of the plurality of subpixels and compensate for luminescence lifespans of the plurality of subpixels.

20 Claims, 3 Drawing Sheets

DISPLAY PANEL AND MANUFACTURING METHOD THEREOF

FIELD OF APPLICATION

The present application is related to the field of display technology, and specifically, to a display panel and a manufacturing method thereof.

BACKGROUND OF APPLICATION

Organic light-emitting diode (OLED) displays are new-generation displays. An OLED display device generally includes a cathode, an anode, and an organic thin film disposed between the cathode and the anode. After a voltage is applied between the cathode and the anode, the organic thin film emits light. Compared with liquid crystal displays, the OLED displays have many advantages such as self-illumination, fast response times, wide viewing angles, and saturated colors.

Printed OLED display device is a display technology combining modern printing process and the OLED displays. It has advantages of simple process, high material utilization rate, low costs, environmental protection, and flexibility, ans has gradually become mainstream technology in the display field. Because a lifespan of light-emitting materials corresponding to red, green, and blue subpixels has a certain limit, after the OLED display device works for a period of time, brightness and the lifespan of the light-emitting materials will decrease, thereby affecting display effects of the OLED display device.

Therefore, current OLED display devices need to be improved.

SUMMARY OF APPLICATION

The present application provides a display panel and a manufacturing method thereof to solve problems of a display panel in the prior art that because a lifespan of light-emitting materials of subpixels has a certain limit, after the display panel works for a period of time, brightness and the lifespan of the light-emitting materials will decrease, thereby affecting display effects of the display panel.

In order to solve the above problems, the present application provides technical solution as follows.

An embodiment of the present application provides a display panel including a substrate, a pixel defining layer disposed on the substrate, and a plurality of subpixels. The pixel defining layer is disposed on the substrate and defines a plurality of subpixel areas. The plurality of subpixels are disposed in the plurality of subpixel areas in one-to-one correspondence. Each of the plurality of subpixels includes a primary pixel and a secondary pixel surrounding the primary pixel. The primary pixel and the secondary pixel are independently driven by different driving circuits, respectively. The pixel defining layer includes a first pixel defining layer, a second pixel defining layer, and a third pixel defining layer. Material of the first pixel defining layer and the third pixel defining layer is a hydrophilic organic material. Material of the second pixel defining layer is a hydrophobic material. A shape of the primary pixel is one or a combination of rectangular, square, rhomboid, triangular, and circular.

In at least one embodiment of the present application, the first pixel defining layer is disposed between the primary pixel and the secondary pixel.

In at least one embodiment of the present application, each of the plurality of subpixels is one of a red subpixel, a green subpixel, or a blue subpixel.

In at least one embodiment of the present application, the second pixel defining layer is disposed between two adjacent subpixels having a same color.

In at least one embodiment of the present application, the third pixel defining layer is disposed between two adjacent subpixels having different colors.

In at least one embodiment of the present application, the first pixel defining layer, the second pixel defining layer, and the third pixel defining layer are disposed in a same layer and have sequentially increasing heights.

An embodiment of the present application further provides a display panel including a substrate, a pixel defining layer disposed on the substrate, and a plurality of subpixels. The pixel defining layer is disposed on the substrate and defines a plurality of subpixel areas. The plurality of subpixels are disposed in the plurality of subpixel areas in one-to-one correspondence. Each of the plurality of subpixels includes a primary pixel and a secondary pixel surrounding the primary pixel. The primary pixel and the secondary pixel are independently driven by different driving circuits, respectively.

In at least one embodiment of the present application, the pixel defining layer includes a first pixel defining layer, a second pixel defining layer, and a third pixel defining layer.

In at least one embodiment of the present application, the first pixel defining layer is disposed between the primary pixel and the secondary pixel.

In at least one embodiment of the present application, each of the plurality of subpixels is one of a red subpixel, a green subpixel, or a blue subpixel.

In at least one embodiment of the present application, the second pixel defining layer is disposed between two adjacent subpixels having a same color.

In at least one embodiment of the present application, the third pixel defining layer is disposed between two adjacent subpixels having different colors.

Material of the first pixel defining layer and the third pixel defining layer is a hydrophilic organic material. Material of the second pixel defining layer is a hydrophobic material.

In at least one embodiment of the present application, the first pixel defining layer, the second pixel defining layer, and the third pixel defining layer are disposed in a same layer and have sequentially increasing heights.

The heights of the first pixel defining layer, the second pixel defining layer, and the third pixel defining layer range from 0.5 to 2 microns.

In at least one embodiment of the present application, a shape of the primary pixel is one or a combination of rectangular, square, rhomboid, triangular, and circular.

An embodiment of the present application further provides a manufacturing method of a display panel including:

S10, forming a pixel defining layer having a plurality of subpixel defining areas on a substrate; and S20, forming a plurality of subpixels in the corresponding plurality of subpixel defining areas, wherein each of the plurality of subpixels includes a primary pixel and a secondary pixel surrounding the primary pixel.

In at least one embodiment of the present application, the step S10 includes:

sequentially forming a hydrophilic first pixel defining layer, a hydrophobic second pixel defining layer, and a hydrophilic third pixel defining layer on the substrate.

In at least one embodiment of the present application, the first pixel defining layer, the second pixel defining layer, and the third pixel defining layer are disposed in a same layer and have sequentially increasing heights.

In at least one embodiment of the present application, the heights of the first pixel defining layer, the second pixel defining layer, and the third pixel defining layer range from 0.5 to 2 microns.

By configuring the subpixels into the primary pixel and the secondary pixel surrounding the primary pixel and driving the primary pixel and the secondary pixel independently, it is beneficial to adjust brightness of the subpixels and compensate for luminescence lifespans of the subpixels. Furthermore, by disposing three pixel defining layers and controlling the height and material type of the three pixel defining layers, it is beneficial to reduce difficulty of printing luminescent materials, thereby facilitating mass production of products.

DESCRIPTION OF DRAWINGS

In order to describe technical solutions in the present application clearly, drawings to be used in the description of embodiments will be described briefly below. Obviously, drawings described below are only for some embodiments of the present application, and other drawings may be obtained by those skilled in the art based on these drawings without creative efforts.

DETAILED DESCRIPTION OF PREFERRED EMBODIMENTS

The present application provides a display panel and a manufacturing method thereof. In order to make the purposes, technical solutions and advantages of the present application clearer, the present application will be further described below in combination with the drawings and the embodiments in detail. It should be understood that the specific embodiments described herein are only adopted to explain the present application and not intended to limit the present application.

Figure 1:
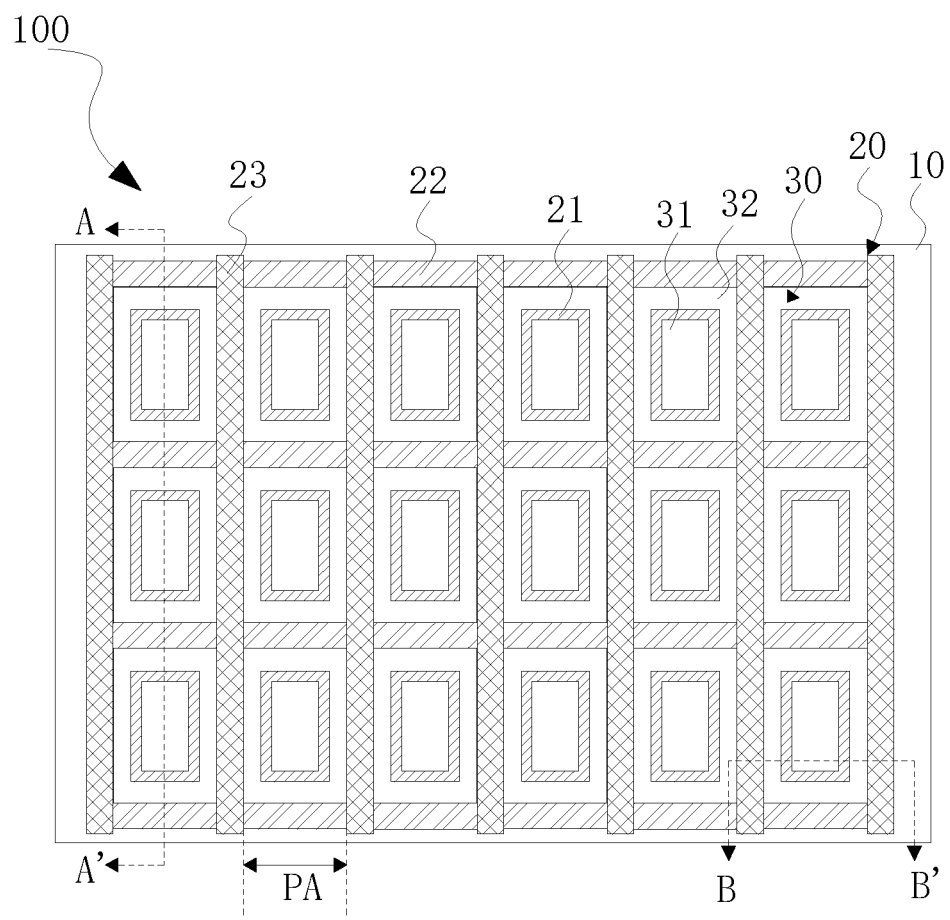
FIG. 1 is a structural diagram of a display panel provided by an embodiment of the present application.

As shown in FIG. 1, an embodiment of the present application provides a display panel 100 including a substrate 10, a pixel defining layer 20 disposed on the substrate 10, and a plurality of subpixels 30. The pixel defining layer 20 defines a plurality of subpixel areas PA. The plurality of subpixels 30 are disposed in the plurality of subpixel areas PA in one-to-one correspondence. One subpixel 30 includes a primary pixel 31 and a secondary pixel 32 surrounding the primary pixel 31. The primary pixel 31 and the secondary pixel 32 are independently driven by different driving circuits, respectively.

The display panel 100 of an embodiment of the present application is an OLED display panel. In the OLED display panel, because a lifespan of light-emitting materials of subpixels has a certain limit, after OLED display devices work for a period of time, brightness and the lifespan of the light-emitting materials will decrease, thereby affecting display effects of the display panel. An embodiment of the present application can solve defects of the brightness and the lifespan of the OLED display panel.

The subpixel 30 of an embodiment of the present application has the primary pixel 31 and the secondary pixel 32. The primary pixel 31 and the secondary pixel 32 have independent drive designs. When the device is in operation, the primary pixel 31 can emit light, and the secondary pixel 32 can be used as a compensation pixel of the device. In a later period, when lifespan of the primary pixel 31 decreases to a certain value, the secondary pixel 32 assists in emitting light. In addition, the secondary pixel 32 of an embodiment of the present application surrounds the primary pixel 31, which can be used to adjust brightness of the corresponding subpixel 30. When a display screen is in a dark state, one of the primary pixel 31 or the secondary pixel 32 can be chosen to light up.

The pixel defining layer 20 at least includes a first pixel defining layer 21. The first pixel defining layer 20 is disposed between the primary pixel 31 and the secondary pixel 32. The first pixel defining layer 21 surrounds the primary pixel 31. The first pixel defining layer 21 is used to define an area of forming the primary pixel 31.

In an embodiment of the present application, the pixel defining layer 20 includes the first pixel defining layer 21, a second pixel defining layer 22, and a third pixel defining layer 23.

The subpixel 30 of an embodiment of the present application is one of a red subpixel, a green subpixel, or a blue subpixel. Any one of the red subpixel is adjacent to the green subpixel or the blue subpixel. One red subpixel, one green subpixel, and one blue subpixel constitute one pixel unit.

The second pixel defining layer 22 is disposed between two adjacent subpixels 30 having a same color, and is used to isolate the two adjacent subpixels 30 having the same color.

The third pixel defining layer 23 is disposed between two adjacent subpixels 30 having different colors, and is used to isolate the two adjacent subpixels 30 having the different colors.

For example, in this embodiment, a first column can be red subpixels, a second column can be blue subpixels, and a third column can be blue subpixels. Colors of the subpixels 30 in a same column are same.

An area size of the subpixel 30 is matched and designed according to its corresponding material efficiency, lifespan, panel aperture ratio, and resolution. For example, a material lifespan of the blue subpixel is weak and luminous efficiency thereof is low, so an area of the blue subpixel can be greater than that of other subpixels. An area of the primary pixel 31 in the blue subpixel can be greater than an area of the secondary pixel 32.

An overall shape of the subpixel 30 can be one or a combination of rectangular, square, rhomboid, triangular, and circular. For example, the blue subpixel can be rectangular, the red subpixel can be triangular, and the green subpixel can be rhomboid, which is not limited herein.

A shape of the primary pixel 31 can be one or a combination of rectangular, square, rhomboid, triangular, and circular. Because the secondary pixel 32 surrounds the primary pixel 31, the shape of the secondary pixel 32 depends on the shape of the primary pixel 31.

Figure 4:
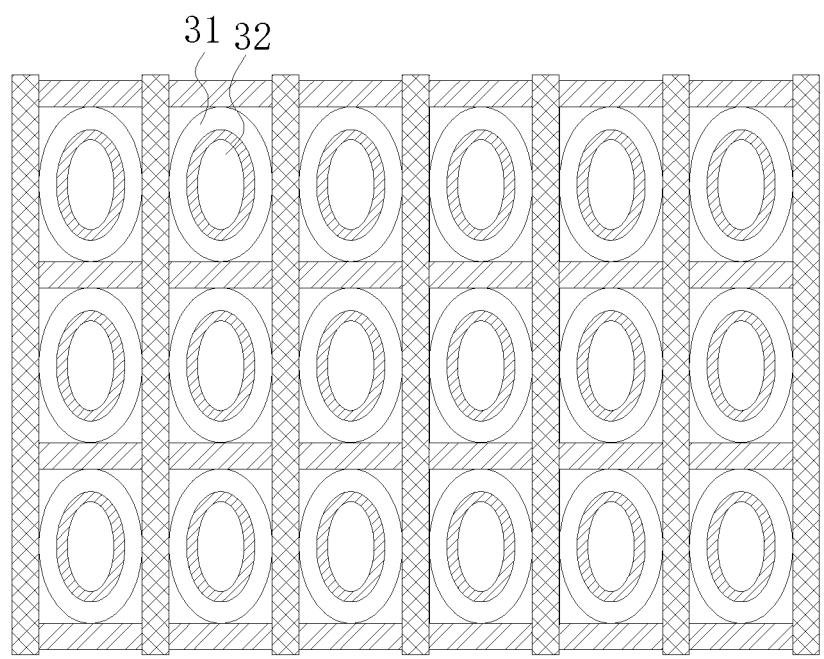
FIG. 4 is a structural diagram of the display panel provided by another embodiment of the present application.

The plurality of primary pixels 31 in this embodiment are all rectangular, and the secondary pixels 32 surround the primary pixels 31 are hollow rectangles. As shown in FIG. 4, the primary pixels can be circular, and the secondary pixels 32 surround the primary pixels 31 can be ring-shaped.

An overall width of the subpixel 30 can range from 30 to 60 microns, and a length thereof can range from 130 to 200 microns. A width of the primary pixel 31 can range from 20 to 40 microns, and a length thereof can range from 70 to 130 microns.

Figure 2:
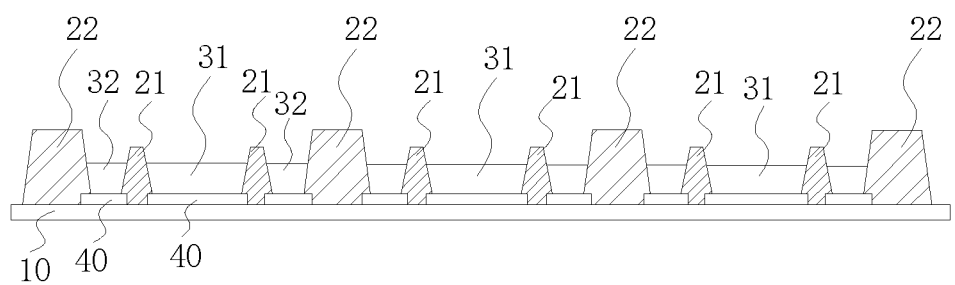
FIG. 2 is a cross-sectional diagram of AA' in FIG. 1.
Figure 3:
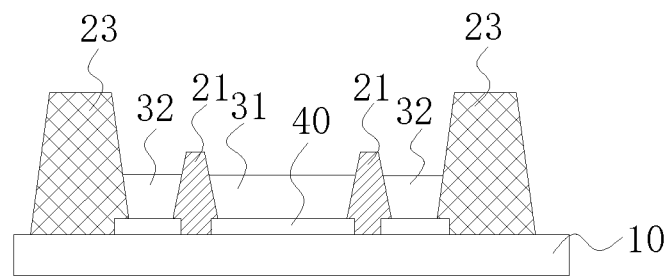
FIG. 3 is a cross-sectional diagram of BB' in FIG. 1.

As shown in FIGS. 2 and 3, the first pixel defining layer 21, the second pixel defining layer 22, and the third pixel defining layer 23 are disposed in a same layer and have sequentially increasing heights.

The heights of the first pixel defining layer 21, the second pixel defining layer 22, and the third pixel defining layer 23 range from 0.5 to 2 microns.

Widths of the first pixel defining layer 21, the second pixel defining layer 22, and the third pixel defining layer 23 are determined according to process capability, and range from 3 to 12 microns.

Material of the first pixel defining layer 21 can be a hydrophilic organic material, which is beneficial to uniformity of printing film formation.

Material of the second pixel defining layer is a hydrophobic organic material, which is beneficial to isolation of sub-pixels of the same color.

Material of the third pixel defining layer is a hydrophilic organic material, which is beneficial to the uniformity of the printing film formation. The third pixel defining layer 23 adopts an in-line bank film formation method, which is beneficial to printing efficiency.

The primary pixel 31 and the secondary pixel 32 include an anode 40, a hole injection layer, a hole transport layer, a luminescent material layer, an electron transport layer, an electron injection layer, and a cathode disposed in sequence.

The anode 40 is disposed on the substrate 10, the luminescent material layer of the primary pixel 31 and the luminescent material layer of the secondary pixel 32 are both disposed on the anode 40 and are respectively located in areas defined by their corresponding pixel defining layers.

The substrate 10 can include a substrate and a plurality of thin-film transistors arranged in an array on the substrate. A thin-film transistor includes metal devices such as a gate, a source, a drain, and a data line.

Figure 5:
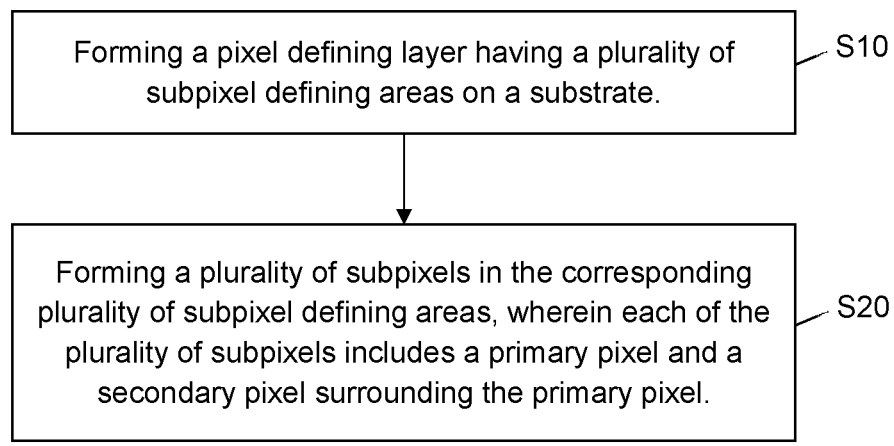
FIG. 5 is a flowchart of a manufacturing method of the display panel provided by an embodiment of the present application.

As shown in FIG. 5, an embodiment of the present application further provides a manufacturing method of the above display panel 100 including following steps:

S10, forming a pixel defining layer 20 having a plurality of subpixel defining areas PA on a substrate 10; and S20, forming a plurality of subpixels 30 in the corresponding plurality of subpixel defining areas PA, wherein each of the plurality of subpixels 30 includes a primary pixel 31 and a secondary pixel 32 surrounding the primary pixel 31.

The step S10 includes: sequentially forming a hydrophilic first pixel defining layer 21, a hydrophobic second pixel defining layer 22, and a hydrophilic third pixel defining layer 23 on the substrate 10.

A patterned anode 40 is formed on the substrate 10. A patterned first pixel defining layer 21, a hydrophobic second pixel defining layer 22, and a hydrophilic third pixel defining layer 23 are sequentially formed on the substrate 10 by a yellow light process.

Then, an OLED light-emitting device is prepared by inkjet printing to form the subpixel 30, which includes: forming a hole injection layer on an anode, wherein a thickness of the hole injection layer ranges from 5 to 20 nanometers; forming a hole transport layer on the hole injection layer, wherein a thickness of the hole transport layer ranges from 10 to 20 nanometers; forming a light-emitting material layer of the subpixel in a corresponding defined area on the hole injection layer, wherein a thickness of a luminescent material layer of a red subpixel ranges from 80 to 120 nanometers, a thickness of the luminescent material layer of a green subpixel ranges from 50 to 80 nanometers, and a thickness of the luminescent material layer of a blue subpixel ranges from 60 to 120 nanometers; forming an electron transport layer on the luminescent material layer by evaporation, wherein a thickness of the electron transport layer ranges from 10 to 30 nanometers; and evaporating a cathode on the electron transport layer, wherein a thickness of the cathode ranges from 10 to 30 nanometers.

By configuring the subpixels into the primary pixel and the secondary pixel surrounding the primary pixel and driving the primary pixel and the secondary pixel independently, it is beneficial to adjust brightness of the subpixels and compensate for luminescence lifespans of the subpixels. Furthermore, by disposing three pixel defining layers and controlling the height and material type of the three pixel defining layers, it is beneficial to reduce difficulty of printing luminescent materials, thereby facilitating mass production of products.

In the above embodiments, the descriptions of the various embodiments are different in emphases, for contents not described in detail, please refer to related description of other embodiments.

The display panel and the manufacturing method thereof provided by embodiments of the present application are described in detail above, and the description of embodiments above is only for helping to understand technical solutions of the present application and its core idea. Understandably, for a person of ordinary skill in the art can make various modifications of the technical solutions of the embodiments of the present application above. However, it does not depart from the scope of the technical solutions of the embodiments of the present application.

What is claimed is:

1. A display panel, comprising:
 a substrate;
 a pixel defining layer disposed on the substrate and defining a plurality of subpixel areas; and
 a plurality of subpixels disposed in the plurality of subpixel areas in one-to-one correspondence;
 wherein each of the plurality of subpixels comprises a primary pixel and a secondary pixel surrounding the primary pixel, and the primary pixel and the secondary pixel are independently driven by different driving circuits, respectively;
 wherein the pixel defining layer comprises a first pixel defining layer, a second pixel defining layer, and a third pixel defining layer, material of the first pixel defining layer and the third pixel defining layer is a hydrophilic organic material, and material of the second pixel defining layer is a hydrophobic material; and
 wherein a shape of the primary pixel is one or a combination of rectangular, square, rhomboid, triangular, and circular.

2. The display panel according to claim 1, wherein the first pixel defining layer is disposed between the primary pixel and the secondary pixel.

3. The display panel according to claim 1, wherein each of the plurality of subpixels is one of a red subpixel, a green subpixel, or a blue subpixel.

4. The display panel according to claim 3, wherein the second pixel defining layer is disposed between two adjacent subpixels having a same color.

5. The display panel according to claim 4, wherein the third pixel defining layer is disposed between two adjacent subpixels having different colors.

6. The display panel according to claim 1, wherein the first pixel defining layer, the second pixel defining layer, and the third pixel defining layer are disposed in a same layer and have sequentially increasing heights.

7. A display panel, comprising:
- a substrate;
- a pixel defining layer disposed on the substrate and defining a plurality of subpixel areas; and
- a plurality of subpixels disposed in the plurality of subpixel areas in one-to-one correspondence;
- wherein each of the plurality of subpixels comprises a primary pixel and a secondary pixel surrounding the primary pixel, and the primary pixel and the secondary pixel are independently driven by different driving circuits, respectively.

8. The display panel according to claim 7, wherein the pixel defining layer comprises a first pixel defining layer, a second pixel defining layer, and a third pixel defining layer.

9. The display panel according to claim 8, wherein the first pixel defining layer is disposed between the primary pixel and the secondary pixel.

10. The display panel according to claim 8, wherein each of the plurality of subpixels is one of a red subpixel, a green subpixel, or a blue subpixel.

11. The display panel according to claim 10, wherein the second pixel defining layer is disposed between two adjacent subpixels having a same color.

12. The display panel according to claim 11, wherein the third pixel defining layer is disposed between two adjacent subpixels having different colors.

13. The display panel according to claim 8, wherein material of the first pixel defining layer and the third pixel defining layer is a hydrophilic organic material, and material of the second pixel defining layer is a hydrophobic material.

14. The display panel according to claim 8, wherein the first pixel defining layer, the second pixel defining layer, and the third pixel defining layer are disposed in a same layer and have sequentially increasing heights.

15. The display panel according to claim 14, wherein the heights of the first pixel defining layer, the second pixel defining layer, and the third pixel defining layer range from 0.5 to 2 microns.

16. The display panel according to claim 7, wherein a shape of the primary pixel is one or a combination of rectangular, square, rhomboid, triangular, and circular.

17. A manufacturing method of a display panel, comprising:
- S10, forming a pixel defining layer having a plurality of subpixel defining areas on a substrate; and
- S20, forming a plurality of subpixels in the corresponding plurality of subpixel defining areas, wherein each of the plurality of subpixels comprises a primary pixel and a secondary pixel surrounding the primary pixel.

18. The manufacturing method of the display panel according to claim 17, wherein the step S10 comprises:
- sequentially forming a hydrophilic first pixel defining layer, a hydrophobic second pixel defining layer, and a hydrophilic third pixel defining layer on the substrate.

19. The manufacturing method of the display panel according to claim 18, wherein the first pixel defining layer, the second pixel defining layer, and the third pixel defining layer are disposed in a same layer and have sequentially increasing heights.

20. The manufacturing method of the display panel according to claim 19, wherein the heights of the first pixel defining layer, the second pixel defining layer, and the third pixel defining layer range from 0.5 to 2 microns.

* * * * *